United States Patent
Hempenius et al.

(10) Patent No.: US 9,946,172 B2
(45) Date of Patent: Apr. 17, 2018

(54) SYSTEM FOR POSITIONING AN OBJECT IN LITHOGRAPHY

(71) Applicant: ASML Netherlands B.V., Veldhoven (NL)

(72) Inventors: Peter Paul Hempenius, Nuenen (NL); Martijn Houben, 's-Hertogenbosch (NL); Nicolaas Rudolf Kemper, Eindhoven (NL); Robertus Mathijs Gerardus Rijs, Eindhoven (NL); Paul Corné Henri De Wit, Eindhoven (NL); Stijn Willem Boere, Veldhoven (NL); Youssef Karel Maria De Vos, Lille (BE); Frits Van Der Meulen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/039,795

(22) PCT Filed: Nov. 14, 2014

(86) PCT No.: PCT/EP2014/074583
§ 371 (c)(1),
(2) Date: May 26, 2016

(87) PCT Pub. No.: WO2015/090753
PCT Pub. Date: Jun. 25, 2015

(65) Prior Publication Data
US 2016/0377996 A1    Dec. 29, 2016

(30) Foreign Application Priority Data
Dec. 20, 2013    (EP) .................................... 13198939

(51) Int. Cl.
G03B 27/52    (2006.01)
G03F 7/20    (2006.01)

(52) U.S. Cl.
CPC .......... G03F 7/70875 (2013.01); G03F 7/709 (2013.01); G03F 7/70775 (2013.01)

(58) Field of Classification Search
CPC ... G03F 7/70775; G03F 7/70875; G03F 7/709
(Continued)

(56) References Cited

U.S. PATENT DOCUMENTS

| 5,413,167 A | 5/1995 | Hara et al. |
| 7,196,768 B2 | 3/2007 | Ottens et al. |

(Continued)

FOREIGN PATENT DOCUMENTS

| JP | 04-85918 | 3/1992 |
| JP | 09-260279 | 10/1997 |

(Continued)

OTHER PUBLICATIONS

International Search Report and Written Opinion dated Feb. 11, 2015 in corresponding International Patent Application No. PCT/EP2014/074583.

(Continued)

*Primary Examiner* — Peter B Kim
(74) *Attorney, Agent, or Firm* — Pillsbury Winthrop Shaw Pittman LLP

(57) ABSTRACT

A lithographic apparatus includes: an object that is moveable in at least one direction; a control system to move the object in the at least one direction, wherein the control system is arranged to control movement of the object in the at least one direction in a frequency range of interest; and a conduit provided with a fluid, wherein the conduit is arranged on or in the object in a pattern, and wherein the pattern is such that an acceleration of the object in the at least one direction (Continued)

causes an acceleration pressure profile in the fluid along the conduit, the acceleration pressure profile not matching with a resonance pressure profile that corresponds to a standing wave mode in the fluid with a resonance frequency in the frequency range of interest.

20 Claims, 8 Drawing Sheets

(58) Field of Classification Search
USPC .......................................................... 355/30
See application file for complete search history.

(56) References Cited

U.S. PATENT DOCUMENTS

| | | | |
|---|---|---|---|
| 8,168,017 | B2 | 5/2012 | Lipson et al. |
| 8,243,258 | B2 | 8/2012 | Butler et al. |
| 8,913,228 | B2 | 12/2014 | Wijckmans et al. |
| 2001/0045269 | A1 | 11/2001 | Yamada |
| 2006/0087637 | A1 | 4/2006 | Ottens et al. |
| 2007/0242245 | A1 | 10/2007 | Wijckmans et al. |
| 2009/0161085 | A1 | 6/2009 | Butler et al. |
| 2010/0211225 | A1 | 8/2010 | Heiland |
| 2011/0211178 | A1 | 9/2011 | Sogard et al. |

FOREIGN PATENT DOCUMENTS

| | | |
|---|---|---|
| JP | 2004-095993 | 3/2004 |
| JP | 2005-209793 | 8/2005 |
| JP | 2006-128682 | 5/2006 |
| JP | 2007-281462 | 10/2007 |
| JP | 2008-199006 | 8/2008 |
| JP | 2009-141349 | 6/2009 |

OTHER PUBLICATIONS

English translation of Japanese Office Action dated Jun. 29, 2017 in corresponding Japanese Patent Application No. 2016-533690.

SYSTEM FOR POSITIONING AN OBJECT IN LITHOGRAPHY

CROSS-REFERENCE TO RELATED APPLICATIONS

This application is the U.S. national phase entry of PCT patent application no. PCT/EP2014/074583, which was filed on Nov. 14, 2014, which claims the benefit of priority of EP patent application no. 13198939.4, which was filed on Dec. 20, 2013 and which is incorporated herein in its entirety by reference.

BACKGROUND

Field of the Invention

The present invention relates to a lithographic apparatus, an object positioning system, a method for positioning an object and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises one or more objects that need to be positioned, e.g. a substrate table constructed to hold a substrate or a support constructed to support a patterning device. When an object needs to be positioned accurately, temperature control of the object and its environment may become relevant in order to minimize positioning errors caused by temperature differences. Temperature differences can occur between parts of the object and/or over time.

Temperature control may be provided in the form of a conduit being arranged on or in the object and being configured to receive a fluid within the conduit, such that the fluid can be used to transport heat from or to the object depending on the thermal condition of the object.

SUMMARY

Notwithstanding the fact that flow of the fluid may cause disturbances as well, acceleration of the object, conduit and fluid therein in a direction of acceleration causes a pressure gradient in the fluid in the direction of acceleration. This pressure gradient may excite standing wave modes in the conduit. The excited standing wave modes may result in a significant disturbance force on the object. The resulting disturbance force may have a negative impact on the positioning accuracy of the object, especially when the standing wave modes have a resonance frequency in a frequency range of interest in which disturbances applied to the object need to be minimized, for instance because a corresponding control system configured to position the object in at least one direction has a frequency range in which it is not able to properly compensate for disturbances.

It is therefore desirable to provide an object that can be temperature controlled, wherein the temperature control does not introduce or minimally introduces disturbances in a frequency range of interest.

According to an embodiment of the invention, there is provided a lithographic apparatus comprising:
  an object that is moveable in at least one direction;
  a control system to move the object in the at least one direction, wherein the control system is arranged to control movement of the object in the at least one direction in a frequency range of interest;
  a conduit provided with a fluid;
wherein the conduit is arranged on or in the object in a pattern, wherein the pattern is such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

According to another embodiment of the invention, there is provided an object positioning system comprising:
  an object to be positioned relative to a reference in at least one direction;
  a measurement system with one or more sensors to provide an output based on a position of the object relative to the reference;
  an actuator system with one or more actuators to position the object;
  a control system configured to control the actuator system based on the output of the measurement system and a set point representing a desired position of the object, wherein the control system is configured to control the actuator system in a frequency range of interest;
  a conduit provided with a fluid;
wherein the conduit is arranged on or in the object in a pattern, wherein the pattern is such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

According to another embodiment of the invention, there is provided a method for positioning an object, said method comprising the following steps:
  a. providing the object, wherein the object is moveable in at least one direction;
  b. providing a control system to move the object in the at least one direction in a frequency range of interest;
  c. providing a conduit on or in the object;
  d. providing the conduit with a fluid for temperature control of the object;
  e. forming the conduit in a pattern, such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

According to a further embodiment of the invention, there is provided a device manufacturing method in which use is made of a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
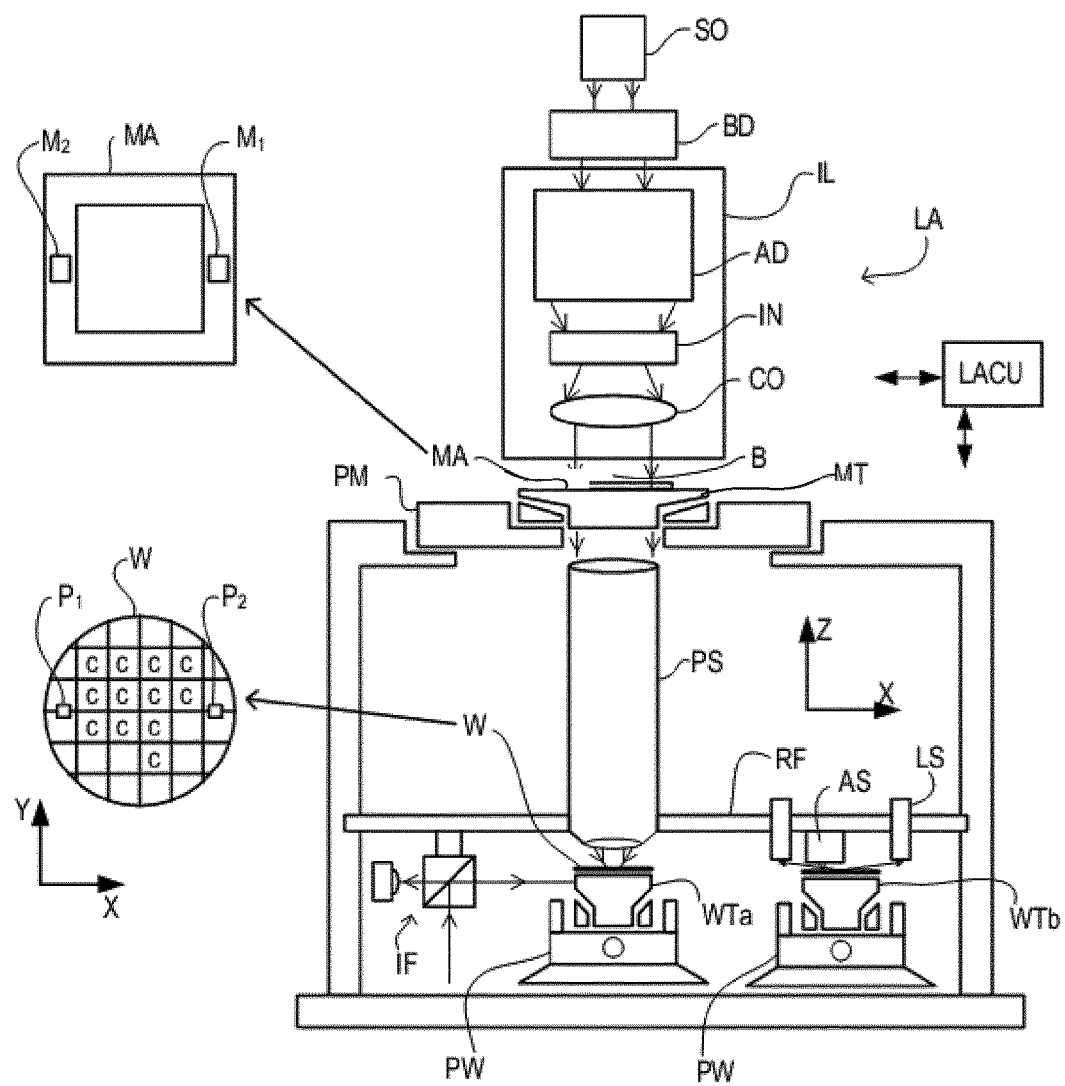
FIG. 1 depicts a lithographic apparatus according to an embodiment of the invention.

FIG. 1 schematically depicts a lithographic apparatus according to one embodiment of the invention. The lithographic apparatus comprises:
- an illumination system (illuminator) IL configured to condition a radiation beam B.
- a support structure (e.g. a mask table) MT constructed to support a patterning device (e.g. a mask) MA and connected to a first positioner PM configured to accurately position the patterning device MA in accordance with certain parameters;
- a substrate table (e.g. a wafer table) WTa or WTb constructed to hold a substrate (e.g. a resist-coated wafer) W and connected to a second positioner PW configured to accurately position the substrate W in accordance with certain parameters; and
- a projection system PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompasses all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices MA include reticles, masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive patterning device MA). Alternatively, the apparatus may be of a reflective type (e.g. employing a programmable mirror array of a type as referred to above, or employing a reflective patterning device).

The lithographic apparatus may be of a type having two (dual stage) or more substrate tables WT (and/or two or more support structures). In such "multiple stage" machines the additional tables may be used in parallel, or preparatory steps may be carried out on one or more tables while one or more other tables are being used for exposure. The lithographic apparatus may comprise a measurement table that is arranged to hold measurement equipment, such as sensors to measure properties of the projection system PS. In an embodiment, the measurement table is not able to hold a substrate. The two substrate tables WTa and WTb in the example of FIG. 1 are an illustration a dual stage lithographic apparatus.

In an embodiment, there is provided a lithographic apparatus comprising: an object that is moveable in at least one direction; a control system to move the object in the at least one direction, wherein the control system is arranged to control movement of the object in the at least one direction in a frequency range of interest; and a conduit provided with a fluid, wherein the conduit is arranged on or in the object in a pattern, and wherein the pattern is such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

In an embodiment, the conduit comprises two ports arranged to allow fluid to enter and leave the conduit, and wherein the two ports are arranged at a same side of the object. In an embodiment, the pattern is such that a portion of the conduit is arranged at or near the two ports, wherein the portion of the conduit is half way the conduit. In an embodiment, the length of the conduit is adapted such that the resonance frequency of all standing wave modes lie above the frequency range of interest. In an embodiment, the conduit extends over a distance in the at least one direction, wherein the distance is at most 70%, preferably at most 60%, more preferably at most 50% of a dimension of the object in the at least one direction. In an embodiment, the object comprises multiple conduits, wherein each of the conduits is arranged in the pattern. In an embodiment, the conduit is part of a temperature conditioning system comprising a heat exchanger and a pump, wherein the heat exchanger is configured to condition a temperature of the fluid prior to being provided to the object, and wherein the pump is configured to transport the fluid from and to the object. In an embodiment, the lithographic apparatus comprises a projection system, a substrate table and a support structure, wherein the projection system is configured for projecting a pattern on a patterning device onto a substrate, wherein the support structure is configured for holding the patterning device, wherein the substrate table is configured for holding the substrate, and wherein the object comprises one of the support structure and the substrate table. In an embodiment, the lithographic apparatus comprises a further conduit connected to the conduit, wherein the further conduit is arranged to have a further standing wave mode in the fluid in the further conduit, and wherein a frequency of the further standing wave mode equals the resonance frequency.

In an embodiment, there is provided an object positioning system comprising: an object to be positioned relative to a reference in at least one direction; a measurement system with one or more sensors to provide an output based on a position of the object relative to the reference; an actuator system with one or more actuators to position the object; a control system configured to control the actuator system based on the output of the measurement system and a set point representing a desired position of the object, wherein the control system is configured to control the actuator system in a frequency range of interest; and a conduit provided with a fluid, wherein the conduit is arranged on or in the object in a pattern, and wherein the pattern is such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

In an embodiment, the length of the conduit is adapted such that the resonance frequency of all standing wave modes lie above the frequency range of interest. In an embodiment, the object positioning system comprises a further conduit connected to the conduit, wherein the further conduit is arranged to have a further standing wave mode in the fluid in the further conduit, and wherein a frequency of the further standing wave mode equals the resonance frequency.

In an embodiment, there is provided a method for positioning an object, the method comprising: providing the object, wherein the object is moveable in at least one direction; providing a control system to move the object in the at least one direction in a frequency range of interest; providing a conduit on or in the object; providing the conduit with a fluid for temperature control of the object; and forming the conduit in a pattern, such that an acceleration of the object in the at least one direction causes an acceleration pressure profile in the fluid along the conduit, wherein the acceleration pressure profile does not match with a resonance pressure profile that corresponds to a standing wave mode in the fluid with a resonance frequency in the frequency range of interest.

In an embodiment, the at least one direction corresponds to a main moving direction during a critical operation of the object.

In an embodiment, there is provided a device manufacturing method wherein use is made of a lithographic apparatus as described above.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate, must be submerged in liquid, but rather only means that liquid is located between the projection system PS and the substrate W during exposure.

Referring to FIG. 1, the illumination system IL receives a radiation beam from a radiation source SO. The radiation source SO and the lithographic apparatus LA may be separate entities, for example when the radiation source SO is an excimer laser. In such cases, the radiation source SO is not considered to form part of the lithographic apparatus LA and the radiation beam is passed from the radiation source SO to the illumination system IL with the aid of a beam delivery system BD comprising, for example, suitable directing mirrors and/or a beam expander. In other cases the radiation source SO may be an integral part of the lithographic apparatus LA, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illumination system IL may comprise various other components, such as an integrator IN and a condenser CO. The illumination system IL may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (comprising e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device MA may be realized with the aid of a long-stroke module and a short-stroke module, which both form part of the first positioner PM. The long-stroke module is arranged to move the short-stroke module over a long range with limited precision. The short-stroke module is arranged to move the patterning device MA over a short range relative to the long-stroke module with a high precision. Similarly, movement of the substrate table WTa/WTb may be realized using a long-stroke module and a short-stroke module, which both form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Marks located in spaced between the target portions C are known as scribe-lane alignment marks. Similarly, in situations in which more than one die is provided on the patterning device MA, the mask alignment marks M1, M2 may be located between the dies.

The depicted apparatus could be used in at least one of the following three modes:

The first mode is the step mode. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

The second mode is the scan mode. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In the third mode, the support structure MT is kept essentially stationary holding a programmable patterning device MA, and the substrate table WTa/WTb is moved or scanned while a pattern imparted to the radiation beam is projected onto a target portion C. In this mode, generally a pulsed radiation source is employed and the programmable patterning device MA is updated as required after each movement of the substrate table WTa/WTb or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables WT can be exchanged. While one substrate W on one substrate table WT is being exposed at the exposure station, another substrate W can be loaded onto the other substrate table WT at the measurement station so that various preparatory steps may be carried out. The preparatory steps may include mapping the surface of the substrate using a level sensor LS and measuring the position of substrate alignment marks P1, P2 on the substrate using an alignment sensor AS. This enables a substantial increase in the throughput of the apparatus. If the position sensor IF is not capable of measuring the position of the substrate table WT while it is at the measurement station as well as at the exposure station, a second position sensor may be provided to enable the positions of the substrate table WT to be tracked at both stations. Instead of two substrate tables WTa and WTb, the lithographic apparatus may comprise one substrate table WT and a measurement table that is arranged to hold measurement equipment, such as sensors to measure properties of the projection system PS.

The lithographic apparatus LA further includes a control unit LACU which controls all the movements and measurements of the various actuators and sensors described. Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the second positioner PW. Separate units may handle different actuators, or different axes. Another sub-unit might be dedicated to the readout of the position sensor IF. Overall control of the lithographic apparatus LA may be controlled by a central processing unit. The central processing unit may communicate with the sub-units, with operators and with other apparatuses involved in the lithographic manufacturing process.

The support structure MT and the substrate table WTa/WTb are examples of objects within the lithographic apparatus that may need to be positioned (accurately) relative to a reference, e.g. the projection system PS. Other examples of objects that may be positionable are optical elements in the projection system PS.

In order to position objects relative to a reference within the lithographic apparatus, the lithographic apparatus comprises at least one object positioning system according to the invention, which will be described in more detail below.

Although in the remainder of this description the general term "object" will be used, it will be apparent that this term can be replaced by substrate table WT, support structure MT, optical element, projection system PS, etc., where applicable.

Figure 2:
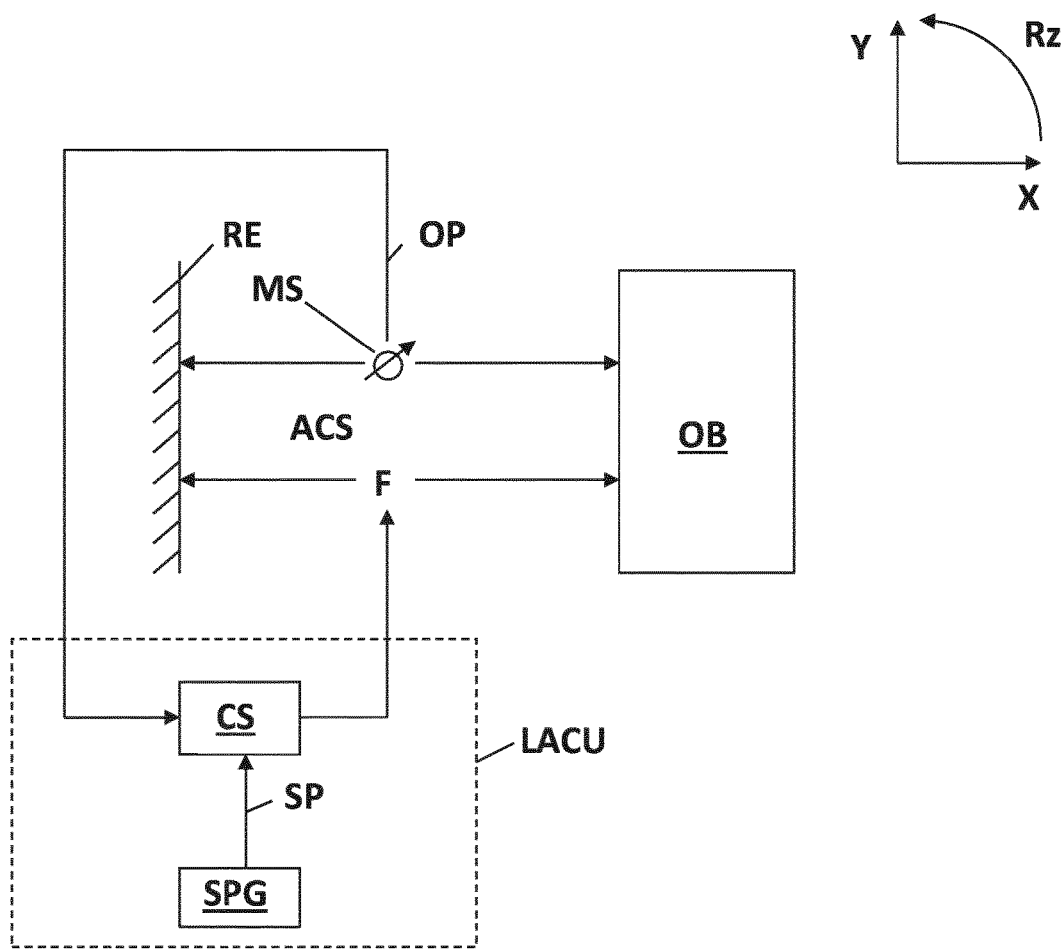
FIG. 2 depicts an object positioning system according to an embodiment of the invention.

An example of an object positioning system is schematically depicted in FIG. 2 and comprises:
- an object OB, e.g. a substrate table WT or support structure MT as shown in FIG. 1, to be positioned relative to a reference RE, e.g. a projection system PS;
- a measurement system MS with one or more sensors, e.g. position sensors IF of FIG. 1, for providing an output OP based on the position of the object OB in one or more degrees of freedom, e.g. translational directions X,Y or rotational direction Rz, relative to the reference RE;
- an actuator system ACS with one or more actuators for positioning the object OB, preferably by applying a force F to the object OB; and
- a control system CS configured to drive the actuator system ACS in dependency of the output OP of the measurement system MS and a set point SP representing a desired position of the object OB.

In FIG. 2 the actuator system ACS is shown as applying a force F between the object OB and the reference RE, however, it is not necessary per se that the force F is applied to the reference RE. In order to minimize disturbances as a result of the applied forces a so-called separate force frame may be provided which is uncoupled from the reference RE allowing to apply force F to the object OB without disturbing the reference RE which is used by the measurement system MS to determine the position of the object relative to the reference RE.

In FIG. 2 the measurement system MS is shown as measuring the position of the object OB relative to the reference RE. Although this figure may suggest that a direct measurement is performed, it is also possible that the measurement system is configured to measure the position of the object OB relative to another structure. The measurement system MS is considered to measure the position of the object OB in one or more degrees of freedom relative to the reference RE as long as this position can be deducted from the output OP of the measurement system MS. Examples of degrees of freedom which can be measured by the measurement system MS are an X-direction, a Y-direction perpendicular to the X-direction, and a rotational direction Rz about an axis perpendicular to both the X- and Y-direction, commonly referred to as the Z-direction.

The set point SP may be provided to the control system CS by a set point generator SPG. Both the set point generator SPG and the control system CS may be part of the control unit LACU as also depicted in FIG. 1.

Figure 3:
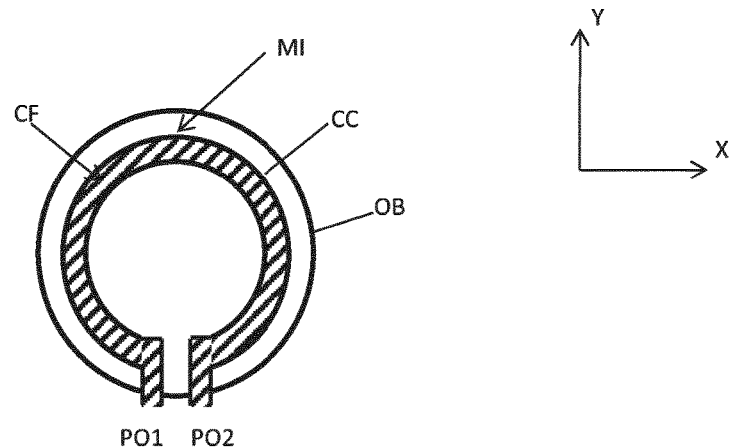
FIG. 3 depicts an object including a conduit according to an embodiment of the invention.

FIG. 3 depicts a schematic top view of an object OB including a conduit CC for receiving fluid CF to control the temperature of the object OB. The conduit CC may for instance be formed in the object OB by milling and subsequently covering the milled conduit CC with a top part (not shown). The conduit CC is preferably part of a temperature conditioning system comprising a heat exchanger and a pump. The heat exchanger is configured to condition the fluid before it is applied to the object. The pump is configured to transport the fluid from and to the object OB.

In prior art temperature conditioning systems, the focus is on temperature control alone when choosing a pattern for the conduit. Hence, the temperature conditioning requirement of the object OB determines the pattern of the conduit so that temperature control of the object OB is optimized. However, the known pattern is not optimal for dealing with the disturbances the temperature conditioning system introduces to the object OB. These disturbances may negatively influence the positioning accuracy of the object OB. The conduit CC may be connected to the fixed world via a hose. The hose may be carried by a carrier system that is arranged between the object OB and the fixed world. To isolate the conduit CC from dynamic disturbances caused by movement of the carrier system, a so called pressure pulse limiter or pressure vessel may be provided between the carrier system and the conduit CC. The pressure pulse limiter or pressure vessel acts as very soft springs, thereby canceling out pressure variations in the fluid introduced by the carrier system.

However, even in case of pressure pulse limiter or pressure vessel, the fluid CF in the conduit CC may still introduce significant disturbances. It has been found by the inventors that acceleration of the object OB in a direction of acceleration causes an acceleration pressure profile in the fluid along the conduit CC. The acceleration pressure profile may excite a resonance mode of the fluid in the conduit CC. The resonance mode may be referred to as a standing wave mode in the fluid CF.

In FIG. 3, the conduit CC has two ports PO1, PO2 to allow fluid CF to enter or leave the conduit CC. In this exemplary embodiment, we will consider the ports PO1, PO2 to be positions where the pressure is constant. The pressure at the ports PO1 and PO2 may be made substantially constant by the presence of pressure pulse limiters or pressure vessels as described above near the ports PO1, PO2.

The object OB in FIG. 3 is moveable in two directions corresponding to the X-direction and the Y-direction. In this embodiment, the two ports PO1, PO2 are arranged at the same side of the object OB, and the conduit CC is arranged at the circumference of the object OB resulting in acceleration pressure profiles as indicated in FIGS. 4 and 5 for respectively an acceleration of the object OB in the X-direction and an acceleration of the object OB in the Y-direction.

Figure 4:
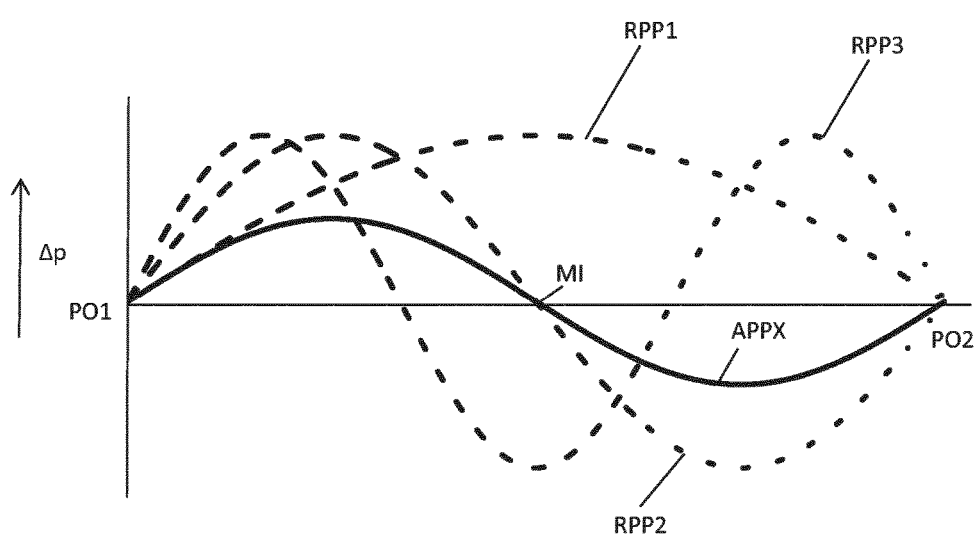
FIG. 4 depicts a graph indicating an acceleration pressure profile when the object of FIG. 3 is accelerated in X-direction.
Figure 5:
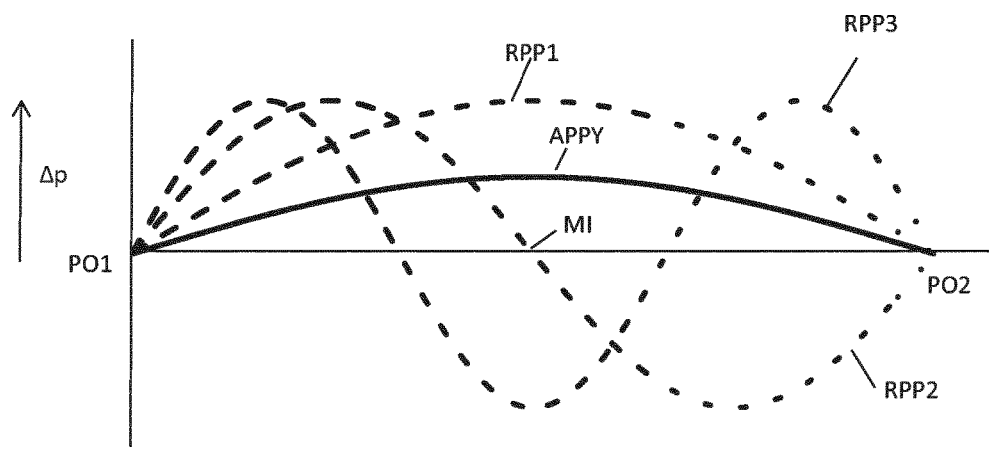
FIG. 5 depicts a graph indicating an acceleration pressure profile when the object of FIG. 3 is accelerated in Y-direction.

FIGS. 4 and 5 depict a graph of the relative pressure Δp in the fluid CF along the conduit CC. The position of the ports PO1, PO2 in the respective graphs is therefore indicated for clarity reasons. The symbol MI in the graph and in FIG. 3 indicates a position half way the conduit CC between ports PO1, PO2. The solid line is representative for an acceleration pressure profile APPX, APPY caused by respectively an acceleration in X- and Y-direction.

The fluid CF in the conduit CC may act as a multi-mass spring damper system in longitudinal direction of the conduit CC due to for instance the elasticity of the fluid CF and/or elasticity of the conduit CC and/or the elasticity of the cable or hose that may be connected to the conduit CC. The mass of the fluid CF and the elasticity result in eigen modes of the fluid CF in the conduit CC. The eigen modes may also referred to as standing wave modes.

The first standing wave mode acts like a system having two masses and a spring in between. The corresponding resonance frequency $f_r$ is determined by the speed of sound of the fluid CF and the length of the conduit CC and follows from the following equation:

$$f_r = \frac{c}{2L} \qquad \text{(equation 1)}$$

in which c yields the speed of sound and L yields the length of the conduit CC. In a similar way higher order standing wave modes can be defined using additional masses and springs. Each standing wave mode has a characteristic resonance pressure profile. FIGS. 4 and 5 indicate the resonance pressure profile associated with the first standing wave mode RPP1, a second standing wave mode RPP2 and a third standing wave mode RPP3.

When comparing the acceleration pressure profile APPX with the resonance pressure profiles RPP1, RPP2 and RPP3 of respectively the first, second and third standing wave mode in the conduit CC, it can be concluded that the acceleration pressure profile APPX matches with the second resonance pressure profile RPP2. The acceleration pressure profile APPX does not match with one of the other two resonance pressure profiles RPP1 and RPP3.

To determine whether an acceleration pressure profile matches with a resonance pressure profile a matching factor may be determined. In an embodiment, the matching factor is determined by multiplying a normalized acceleration pressure profile with a normalized resonance pressure profile and integrating the result over the length of the conduit CC. The absolute value of the matching factor will have a maximum value when the acceleration pressure profile has an equal shape as the resonance pressure profile and a minimum value of zero when there is absolutely no match between the acceleration pressure profile and the resonance pressure profile. Hence, the acceleration pressure profile may be considered to match a resonance pressure profile when the corresponding matching factor is larger than a predetermined threshold. The predetermined threshold may for instance be 50% of the maximum value, but other values such as 30%, 40%, 60% and 70% are also possible depending on the required positioning accuracy of the object OB. When the matching factor is below the predetermined threshold, the acceleration pressure profile and the resonance pressure profile are considered not to match.

In an alternative embodiment, the matching factor may be determined by firstly describing, or at least approximating, a normalized acceleration pressure profile as a sum of resonance pressure profiles and secondly determining the relative contribution of each resonance pressure profile to describe the acceleration pressure profile. The sum of resonance pressure profiles may e.g. be in the form of normalized resonance pressure profiles multiplied by a corresponding amplitude value. The relative contribution, i.e. the matching factor, may for instance be determined by looking at the absolute value of the amplitude value. Similar to the other embodiment described above, if the matching factor for a resonance pressure profile is above a predetermined threshold, the acceleration pressure profile and resonance pressure profile are considered to match.

This means that when the object OB is accelerated in X-direction with frequency content below the resonance frequency associated with the second standing wave mode, no standing wave modes are excited or at least the first standing wave mode is minimally excited due to the mismatch between the acceleration pressure profile APPX and the resonance pressure profile RPP1 and thus no significant disturbances are introduced by accelerating the object OB in the X-direction. When the object OB is accelerated in X-direction with frequency content above the resonance frequency associated with the second standing wave mode, the second standing wave mode is excited and disturbances may be introduced by accelerating the object OB in the X-direction.

When comparing the acceleration pressure profile APPY with the resonance pressure profiles RPP1, RPP2 and RPP3 of respectively the first, second and third standing wave mode in the conduit CC, it can be concluded that the acceleration pressure profile APPY and the resonance pressure profile RPP1 match and the acceleration pressure profile APPY. The resonance pressure profiles RPP2 and RPP3 do not match with the acceleration pressure profile APPY. Hence, accelerating the object OB in the Y-direction may excite the first standing wave mode and introduce disturbances.

However, the suitability of the pattern of the conduit CC depends on the control system CS used to position the object OB in at least one direction.

The control system CS will tend to minimize the influence of disturbances applied to the object OB, but the rate of success of the control system CS may be limited to a particular frequency range. As a result thereof, there may exist a frequency range of interest which is relevant for the positioning of the object OB, but where the control system CS is not sufficiently capable of compensating for disturbances. Since the control system CS may not be able to sufficiently compensate for disturbances in the frequency range of interest, there may be a need in this frequency range of interest to minimize the (magnitude of the) disturbances themselves.

Hence, when for example the frequency range of interest for accelerations in Y-direction for the example depicted in FIGS. 3-5 does not comprise the resonance frequency corresponding to the first standing wave mode, so that the excitation of the first standing wave mode does not occur or can be compensated for, the pattern of the conduit CC can be used without negatively influencing the positioning of the object OB in this application.

It is also possible that the positioning accuracy in Y-direction is not as demanding as it is for the X-direction, or that the required positioning accuracy is only applicable when the object is accelerated in X-direction only, so that the behavior in Y-direction is less relevant. In that case, the matching with the first standing wave mode in Y-direction may be accepted when the resonance frequency associated with the first standing wave mode lies in the frequency range of interest, but may not be accepted in the X-direction.

Figure 6:
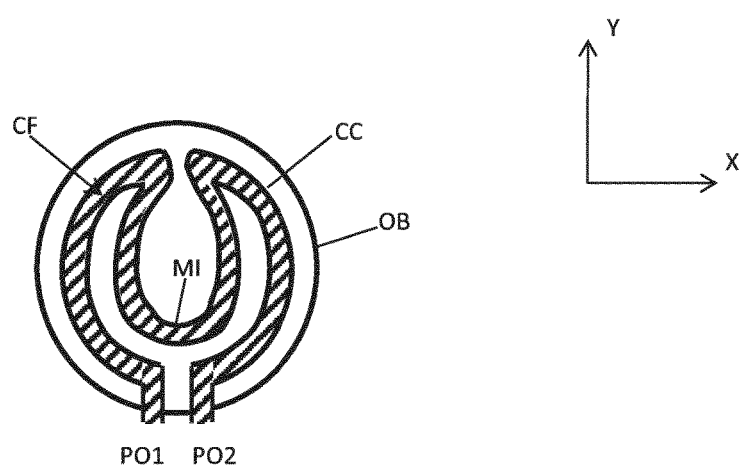
FIG. 6 depicts an object including a conduit according to another embodiment of the invention.

FIG. 6 depicts a schematic top view of an object OB for use in a lithographic apparatus according to another embodiment of the invention. The difference between the object OB according to FIG. 6 and the object OB according to FIG. 3 is the pattern of the conduit CC. When the matching acceleration profile APPY and resonance pressure profile RPP1 of the first standing wave mode of FIG. 5 form a disadvantage, the pattern of the conduit CC of FIG. 6 may provide a suitable alternative.

Figure 7:
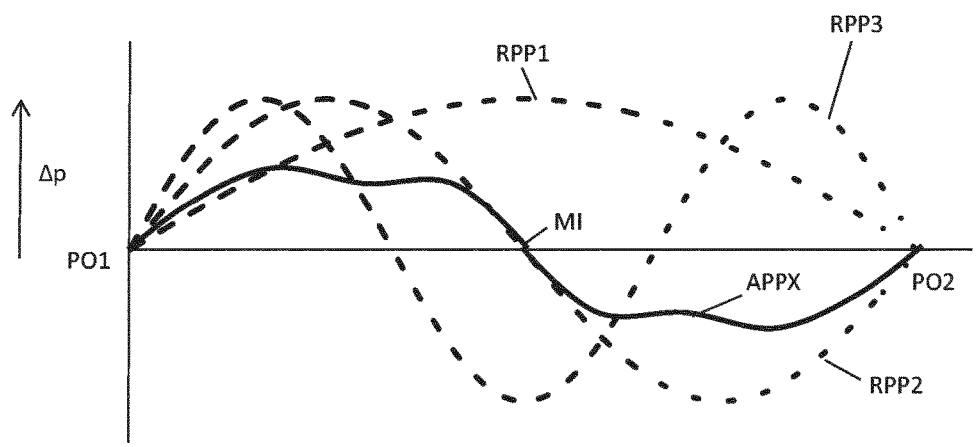
FIG. 7 depicts a graph indicating an acceleration pressure profile when the object of FIG. 6 is accelerated in X-direction.
Figure 8:
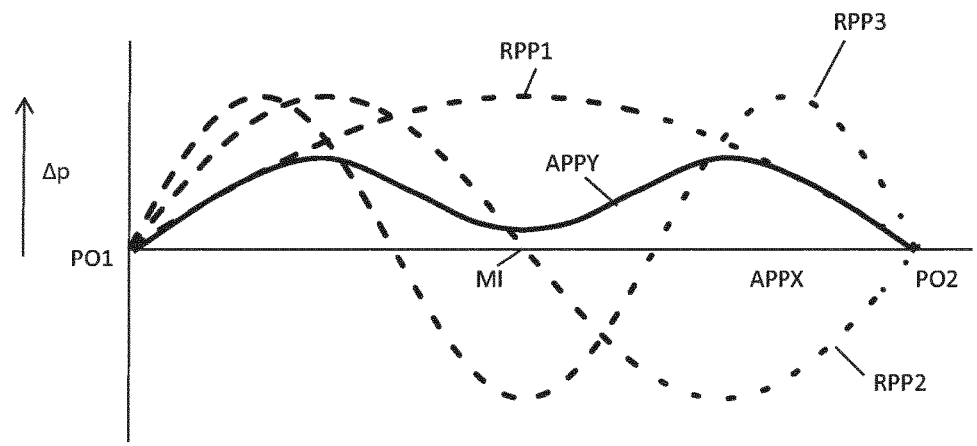
FIG. 8 depicts a graph indicating an acceleration pressure profile when the object of FIG. 6 is accelerated in Y-direction.

The pattern shown in FIG. 6 is characterized in that the point MI half way the conduit CC is positioned close to the ports PO1 and PO2, so that the pressure at the point MI during acceleration is also close to the pressure at ports PO1 and PO2. The resulting acceleration pressure profile when accelerating in X- or Y-direction cannot match with the resonance pressure profile RPP1 of the first standing wave mode as shown in FIGS. 7 and 8 in which APPX and APPY respectively denote the acceleration pressure profile when accelerating in X-direction and in Y-direction. RPP1, RPP2 and RPP3 denote the resonance pressure profiles for respectively the first, second and third standing wave mode.

The alternative pattern in FIG. 6 does not have a significant impact on the behavior in X-direction, although the amount of excitation of the second standing wave mode is reduced, but for the Y-direction it can be concluded that the first standing wave mode is less excited at the cost of the third standing wave having a higher chance of being excited. However, this may not be a problem when the resonance frequency corresponding to the third standing wave mode falls outside the frequency range of interest. In that case meaning the third standing wave mode may be compensated by the control system CS or the third standing wave mode does not negatively affect the accuracy with which the control system CS moves the object OB.

The shape of the acceleration pressure profile APPX, APPY can thus be designed in accordance with the demands of the object positioning system. For instance, as the point MI is positioned near the ports PO1 and PO2, it is possible to position more points along the conduit near the ports PO1 and PO2 thereby defining how many local maxima and minima the acceleration pressure profile has.

Making a mismatch between an acceleration pressure profile APPX, APPY and a resonance pressure profile RPP1, RPP2, RPP3 as a measure to decrease the introduction of disturbances also comprises positioning the resonances corresponding to standing wave modes outside the frequency range of interest, because in other words, there is no resonance pressure profile matching the acceleration pressure profile in the frequency range of interest. Positioning the resonances corresponding to standing wave modes outside the frequency range of interest may be done by increasing the resonance frequencies to above the frequency range of interest. Looking at equation 1, properly positioning the resonance frequency of the first standing wave mode can be accomplished by tuning the speed of sound of the fluid CF or by adapting the length of the conduit CC. Tuning the speed of sound of the fluid CF may be done by selecting a proper liquid, gas or combination of liquid and gas.

The length of the conduit CC may extend over a distance in at least one of the X-direction and Y-direction. The distance over which the conduit CC extends may be at most 70%, preferably at most 60%, more preferably at most 50% of a dimension of the object OB in the at least one of the X-direction and Y-direction. The shorter the distance is over which the conduit CC extends, the smaller the amplitudes of the resonance pressure profiles RPP1, RPP2 and RPP3 are.

In an embodiment, the resonance frequency of the first standing wave mode is positioned above the frequency range of interest by keeping the length of the conduit CC below a corresponding maximum length. In case the length of the conduit CC is too short to cover the object OB, multiple parallel conduits CF can be provided. Each conduit CF has a length below said maximum length.

Figure 9:
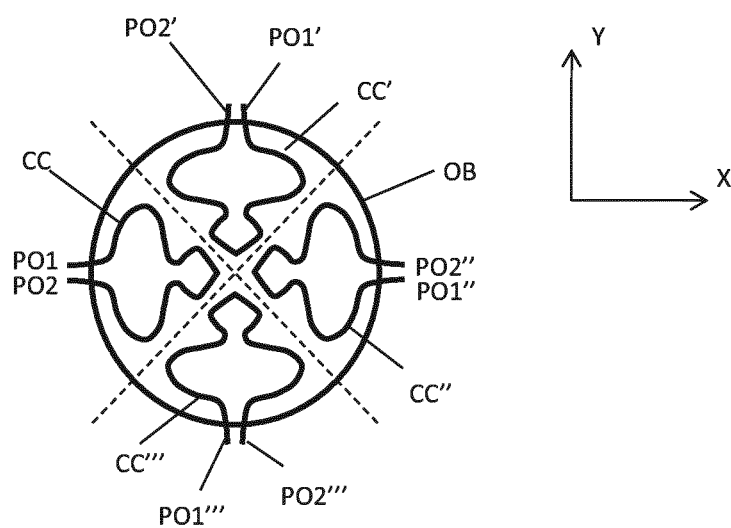
FIG. 9 depicts an object including conduits according to yet another embodiment of the invention.

An example thereof is depicted in FIG. 9, wherein the object OB is covered by four parallel arranged conduits CC, CC', CC", CC''', such that the length of each conduit CC is below a predetermined maximum value. As a result of the length the resonance frequency of the first standing wave mode is outside a frequency range of interest. In this embodiment, each conduit has distinct ports PO1, PO2, PO1', PO2', PO1", PO2", PO1''' and PO2'''.

Another advantage of the configuration of FIG. 9 is that the pattern of a conduit CC extends only partially in both the X-direction and the Y-direction compared to the dimensions of the object in said directions. The result of the pattern is that the amplitude of the acceleration pressure profile caused in the conduits CC is smaller compared to a conduit that extends across the object OB as for instance shown in FIGS. 3 and 6. This has the advantage that if a standing wave mode is excited, the amplitude and thus the effect thereof is smaller.

Figure 10:
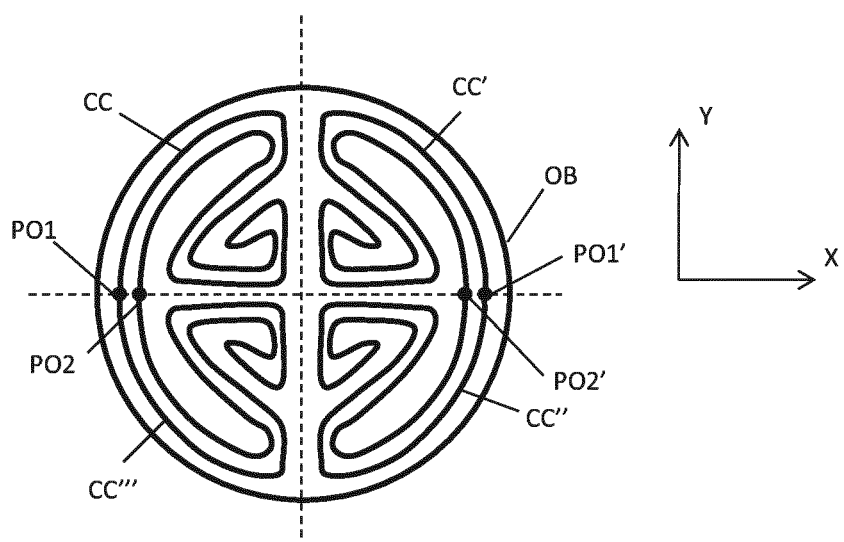
FIG. 10 depicts an object including conduits according to a further embodiment of the invention.

An alternative embodiment is shown in FIG. 10. In this embodiment, also four conduits CC, CC', CC", CC''' are depicted. The difference with the embodiment of FIG. 9 is that conduits CC and CC''' are connected to ports PO1 and PO2. Conduits CC' and CC" are connected to ports PO1' and PO2'. This reduces the number of ports, but maintains the advantage of parallel conduits and limited lengths thereof. In an embodiment, port PO2 is provided with a flow of fluid CF. Port PO2 splits the flow of fluid CF into a first flow and a second flow. The first flow goes into conduit CC and the second flow goes into conduit CC'''. At port PO1, the first flow from conduit CC and the second flow from conduit CC''' are combined into a single flow. In the same way, port PO2' may be provided with a flow of fluid CF. Port PO2' splits the flow of fluid CF into a third flow and a fourth flow. The third flow goes into conduit CC' and the fourth flow goes into conduit CC". At port PO1', the third flow from conduit CC' and the fourth flow from conduit CC" are combined into a single flow. By having a port PO2, PO2' that splits the flow into two separate flows, the lengths of each of the conduits CC, CC', CC" and CC''' maybe reduced.

Figure 11:
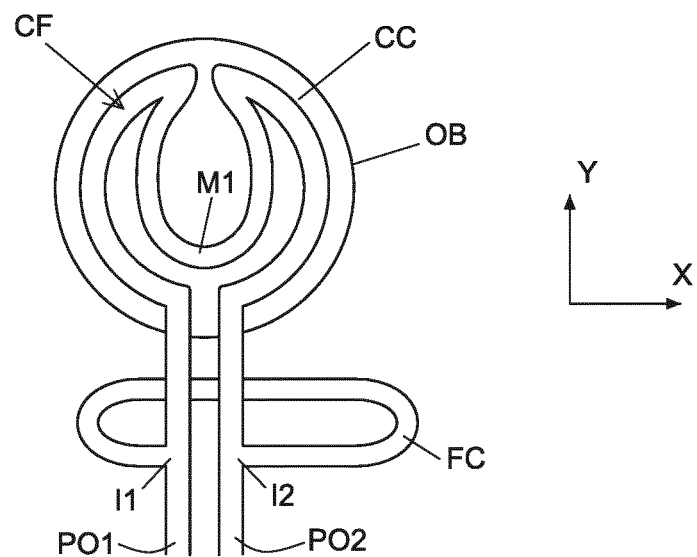
FIG. 11 depicts an object including a conduit according to another embodiment of the invention.

In FIG. 11, a further embodiment according to the invention is shown. FIG. 11 shows the conduit CC and a further conduit FC. The conduit CC and the further conduit FC have a first intersection I1 and a second intersection I2. At the first intersection I1, the fluid CF is split into a part that flows into the conduit CC and a part that flows into the further conduit FC. At the second intersection I2, a part of the fluid CF from the conduit CC and a part of the fluid CF from the further conduit FC flow together into a single fluid flow. The first intersection I1 may be near the port PO1, the second intersection I2 may be near the port PO2.

The length of the further conduit FC may be selected, for example using the formula mentioned above, to have a certain standing wave mode, for example a first standing wave mode. The frequency corresponding to this standing wave mode may be equal to a frequency of a standing wave in the conduit CC that is in the frequency range of interest. By making the frequency of the standing wave of the further conduit FC equal to the frequency of the standing wave in the conduit CC in the frequency range of interest, the amplitude of the standing wave in the conduit CC is reduced. Since the amplitude is reduced, the standing wave in the conduit CC has less negative effect on the performance of the object OB.

In addition to selecting the length of the further conduit FC to create a standing wave in the further conduit FC that reduces the amplitude of the standing wave in the conduit CC, a combination of the length and the stiffness of the further conduit FC may be selected. The stiffness of the further conduit is determined by the wall thickness of the further conduit FC, the size of the further conduit FC, the material from which the further conduit FC is made, and the bulk modulus of the fluid CF. An increase of the stiffness increases the frequency of the standing wave in the further conduit FC. A decrease of the stiffness decreases the frequency of the standing wave in the further conduit FC. The stiffness of the further conduit FC may be different from the stiffness of the conduit CC. For example, the wall thickness of the further conduit FC may be thinner than the wall thickness of the conduit CC. Using a further conduit FC with a low stiffness has the benefit that the length of the further conduit FC may be reduced to create a desired standing wave. In addition or alternatively, the cross section of the further conduit FC may be smaller than the cross section of the conduit CC, in order to prevent adding large amounts of fluid CF.

Instead of one further conduit FC, multiple further conduits FC may be applied. For example, each of the multiple further conduits FC may be arranged to reduce the amplitude of a standing wave with a specific frequency. For example, two further conduits FC may be used to reduce the amplitude of a first standing wave with a first frequency and a second standing wave with a second frequency.

Figure 12:
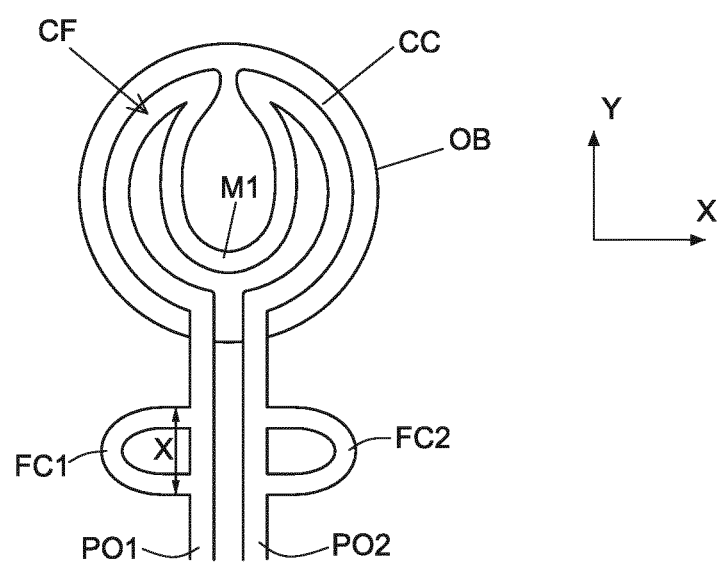
FIG. 12 depicts an object including a conduit according to yet another embodiment of the invention.

In another example there are two further conduits FC, see FIG. 12. The first further conduit FC1 is located upstream of the conduit CC and the second further conduit FC2 is located downstream of the conduit CC. "Located upstream" means that the inlet and the outlet of the first further conduit FC1 are intersecting with the conduit CC upstream compared to the inlet and outlet of the second further conduit FC2. "Located downstream" means that the inlet and the outlet of the second further conduit FC2 are intersecting with the conduit CC downstream compared to the inlet and outlet of the second further conduit FC1. The inlet of the first further conduit FC1 may be upstream compared to the outlet of the first further conduit FC1 to ensure a steady flow of fluid CF through the first further conduit FC1 to prevent entrapment of air in the first further conduit FC1. The inlet of the second further conduit FC2 may be upstream compared to the outlet of the second further conduit FC2 to ensure a steady flow of fluid CF through the second further conduit FC2 to prevent entrapment of air in the second further conduit FC1. The length of the first further conduit FC1 may be selected such that the length corresponds to a standing wave with a desired frequency. The desired frequency may match with a frequency of a standing wave in the conduit CC, that is in a frequency range of interest. A distance X between the inlet and the outlet of the first further conduit FC1 may be chosen such that a phase of the standing wave in the conduit CC at the outlet is out of phase with a phase of the standing wave in the first further conduit FC1 at the outlet. Because the two phases are out of phase at the outlet of the first further conduit FC1, the standing wave in the first further conduit FC1 reduces the amplitude of the standing wave in the conduit CC. The two phases may be 180 degrees out of phase. In a similar way, the second further conduit FC2 reduces the amplitude of the standing wave in the conduit CC. In an embodiment, only one of the first further conduit FC1 and the second further conduit FC2 are used. The first further conduit FC1 and/or the second further conduit FC2 may be used in combination with the further conduit FC described above.

Figure 13:
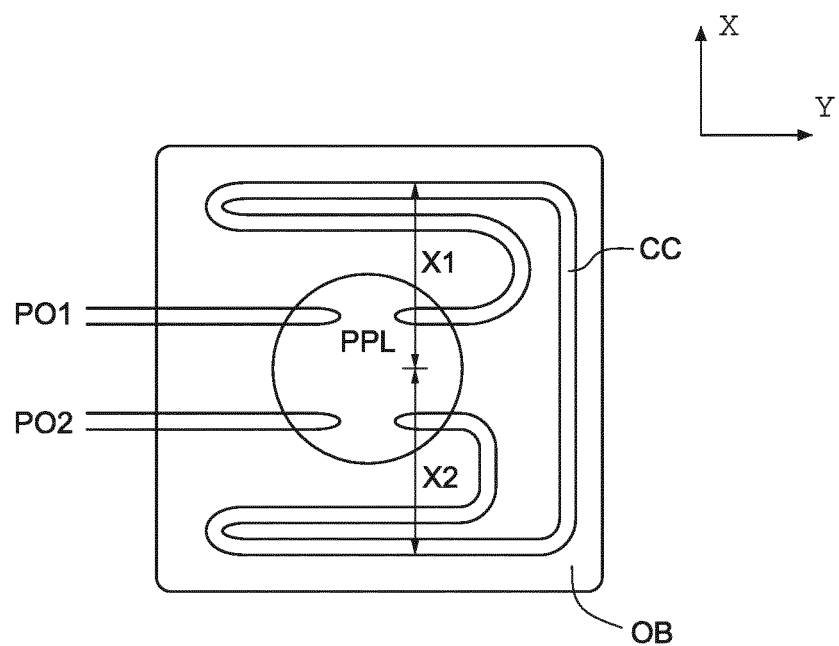
FIG. 13 depicts an object including a conduit according to a further embodiment of the invention.

As described above, a pressure pulse limiter may be used near a port PO1 or PO2. In an embodiment, the pressure pulse limiter PPL is located near or in the centre of the object OB, see FIG. 13. The centre of the object OB may be defined as a location on an axis, wherein a distance between the location and a portion of the conduit CC on the axis the furthest away from the location along a first direction along the axis is substantially the same as a distance between the location and another portion of the conduit CC on the axis the furthest away from the location in a second direction along the axis, wherein the first direction and the second direction are opposite to each other. For example, as shown in FIG. 13, distance x1 represents the distance along the x-axis from the centre of the object to a portion of the conduit CC that is the furthest away from the centre. Distance x2 represents the distance along the x-axis in opposite direction from the centre of the object to another portion of the conduit CC furthest away from the centre. Having the pressure pulse limiter in the centre of the object OB helps to minimize the maximum pressure differences in the conduit CC and thus helps to minimize deformation of the object OB.

Instead of the x-axis, any axis may be used. For example, the axis for defining the centre may be the axis along which the object OB is arranged to accelerate the hardest. Having the pressure pulse limiter in the centre along such an axis has the largest influence on the maximum pressure difference in the conduit CC.

Although specific reference may be made to the first and second standing wave mode, the invention may be applied to any standing wave mode especially when it lies in or near the frequency range of interest.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate W referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device MA may be pressed into a layer of resist supplied to the substrate W whereupon the resist is cured by applying electromagnetic radiation, heat, pressure or a combination thereof. The patterning device MA is moved out of the resist leaving a pattern in it after the resist is cured.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an object that is moveable in at least one direction;
    a conduit configured to receive a fluid; and
    a further conduit intersecting with the conduit, the further conduit configured to receive the fluid,
    wherein the conduit is arranged on or in the object, wherein the fluid in the conduit has a standing wave mode, and wherein the further conduit is arranged to reduce an amplitude of the standing wave mode.

2. The lithographic apparatus of claim 1, wherein the standing wave mode has a resonance frequency, and wherein the fluid in the further conduit has a further standing wave mode with a further resonance frequency, the further resonance frequency being about equal to the resonance frequency.

3. The lithographic apparatus of claim 2, wherein the further conduit intersects with the conduit via an inlet of the further conduit and an outlet of the further conduit, wherein the inlet is configured to allow fluid to flow from the conduit into the further conduit and the outlet is configured to allow fluid from the further conduit to flow into the conduit, and wherein a distance between the inlet and the outlet is chosen such that a phase of the standing wave mode in the conduit at the outlet is out of phase with a phase of the further standing wave mode in the further conduit at the outlet.

4. The lithographic apparatus of claim 3, wherein the phase of the standing wave mode at the outlet is about 180 degrees out of phase with the phase of the further standing wave mode at the outlet.

5. The lithographic apparatus of claim 3, wherein the inlet is upstream of the conduit compared to the outlet.

6. The lithographic apparatus of claim 1, comprising an additional further conduit intersecting with the conduit, the additional further conduit configured to receive the fluid, wherein the fluid in the conduit has an additional standing wave mode, and wherein the additional further conduit is arranged to reduce an amplitude of the additional standing wave mode.

7. The lithographic apparatus of claim 6, wherein the additional standing wave mode has an additional resonance frequency, the additional resonance frequency being different from the resonance frequency.

8. The lithographic apparatus of claim 6, wherein the additional further conduit has an additional inlet and an additional outlet to intersect with the conduit and to receive the fluid, wherein the inlet and the outlet are upstream of the conduit compared to the additional inlet and the additional outlet.

9. The lithographic apparatus of claim 1, wherein a length of the further conduit is selected so as to have a further standing wave mode.

10. The lithographic apparatus of claim 9, wherein a combination of the length and a stiffness of the further conduit is selected so as to have the further standing wave mode.

11. The lithographic apparatus of claim 1, wherein a cross section of the further conduit is smaller than a cross section of the conduit.

12. The lithographic apparatus of claim 1, further comprising a pressure pulse limiter arranged to cancel out pressure variations in the fluid.

13. The lithographic apparatus of claim 12, wherein the pressure pulse limiter is arranged near, or in, a center of the object.

14. The lithographic apparatus of claim 13, wherein the center of the object is a location on an axis, wherein a distance between the location and a portion of the conduit on the axis the furthest away from the location along a first direction along the axis is substantially the same as a distance between the location and another portion of the conduit on the axis the furthest away from the location in a second direction along the axis, wherein the first direction and the second direction are opposite to each other.

15. The lithographic apparatus of claim 14, wherein the axis is the axis along which the object is arranged to accelerate the hardest.

16. The lithographic apparatus of claim 1, further comprising a control system to move the object in the at least one direction, wherein the control system is arranged to control movement of the object in the at least one direction in a frequency range of interest, wherein the conduit is arranged on or in the object in a pattern, wherein the pattern is such that an acceleration of the object in the at least one direction causes an acceleration pressure profile in the fluid along the conduit, and wherein the acceleration pressure profile does not match with a resonance pressure profile that corresponds to a standing wave mode in the fluid with a resonance frequency in the frequency range of interest.

17. An object positioning system comprising:
an object to be positioned relative to a reference;
a measurement system comprising a sensor to provide an output based on a position of the object relative to the reference;
an actuator system comprising an actuator to position the object;
a control system configured to control the actuator system based on the output of the measurement system;
a conduit configured to receive a fluid; and
a further conduit intersecting with the conduit, the further conduit configured to receive the fluid,
wherein the conduit is arranged on or in the object, wherein the fluid in the conduit has a standing wave mode, and wherein the further conduit is arranged to reduce an amplitude of the standing wave mode.

18. The object positioning system of claim 17, wherein the standing wave mode has a resonance frequency, and wherein the fluid in the further conduit has a further standing wave mode with a further resonance frequency, the further resonance frequency being about equal to the resonance frequency.

19. A method of positioning an object, the method comprising:
using a measurement system sensor to provide an output based on a position of an object relative to a reference; and
controlling an actuator system to position the object based on the output of the measurement system,
wherein a conduit configured to receive a fluid is arranged on or in the object, wherein the fluid in the conduit has a standing wave mode, and wherein a further conduit intersects with the conduit, the further conduit configured to receive the fluid and the further conduit arranged to reduce an amplitude of the standing wave mode.

20. The method of claim 19, wherein the standing wave mode has a resonance frequency, and wherein the fluid in the further conduit has a further standing wave mode with a further resonance frequency, the further resonance frequency being about equal to the resonance frequency.

* * * * *